US012740147B2

(12) United States Patent
Sano et al.

(10) Patent No.: US 12,740,147 B2
(45) Date of Patent: Sep. 15, 2026

(54) ELECTRONIC DEVICE

(71) Applicant: Magnolia White Corporation, Tokyo (JP)

(72) Inventors: Takumi Sano, Tokyo (JP); Yasushi Tomioka, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 387 days.

(21) Appl. No.: 18/402,895

(22) Filed: Jan. 3, 2024

(65) Prior Publication Data

US 2024/0243137 A1 Jul. 18, 2024

(30) Foreign Application Priority Data

Jan. 13, 2023 (JP) ................................ 2023-003665

(51) Int. Cl.
*H10D 86/60* (2025.01)
*H10D 86/40* (2025.01)
*H10W 90/00* (2026.01)

(52) U.S. Cl.
CPC ........... *H10D 86/60* (2025.01); *H10D 86/441* (2025.01); *H10D 86/411* (2025.01); *H10W 90/00* (2026.01)

(58) Field of Classification Search
CPC ......... H05K 1/0283; H05K 1/187–189; H05K 2201/09263; H05K 2201/10674; H10W 70/611; H10W 70/65; H10W 70/688; H10K 59/121; H10K 59/65; H10K 59/351; H10K 59/353; H10K 59/818; H04M 1/0264
USPC ................ 361/749–750, 782–784, 795, 803; 174/254–262; 349/149–151
See application file for complete search history.

(56) References Cited

U.S. PATENT DOCUMENTS

| | | | | |
|---|---|---|---|---|
| 7,710,739 B2 * | 5/2010 | Kimura | G02F 1/13452 | 361/767 |
| 9,601,557 B2 * | 3/2017 | Yang | H10D 86/443 | |
| 9,706,647 B2 * | 7/2017 | Hsu | H05K 1/0283 | |
| 9,765,934 B2 * | 9/2017 | Rogers | F21K 9/00 | |
| 2006/0254369 A1 * | 11/2006 | Yoon | A61B 5/6804 | 73/862.041 |
| 2016/0202831 A1 * | 7/2016 | Kim | B65H 5/025 | 345/173 |
| 2016/0358849 A1 * | 12/2016 | Jur | H05K 1/0283 | |
| 2017/0003440 A1 * | 1/2017 | Kim | G02B 6/0041 | |
| 2017/0094774 A1 * | 3/2017 | Elsherbini | H05K 1/028 | |
| 2022/0320259 A1 * | 10/2022 | Sano | G09F 9/30 | |

FOREIGN PATENT DOCUMENTS

| | | | |
|---|---|---|---|
| JP | 2021-106199 A1 | 7/2021 | |
| WO | WO-2021131265 A1 * | 7/2021 | G02F 1/1345 |

* cited by examiner

*Primary Examiner* — Tuan T Dinh

(74) *Attorney, Agent, or Firm* — Michael Best & Friedrich LLP

(57) ABSTRACT

To realize a stretchable electronic device having high reliability. The configuration of the present invention is as follows. In a stretchable electronic device in which an active area and a terminal area are continuously formed, a scanning line having a meander structure and a signal line having a meander structure are formed in the active area, terminal wirings and terminals are formed on a base material extending in a second direction and aligned in a first direction in the terminal area, and the base material configures a reinforcing material continuous in the first direction in the part where the terminal is formed.

15 Claims, 27 Drawing Sheets

F I G . 6
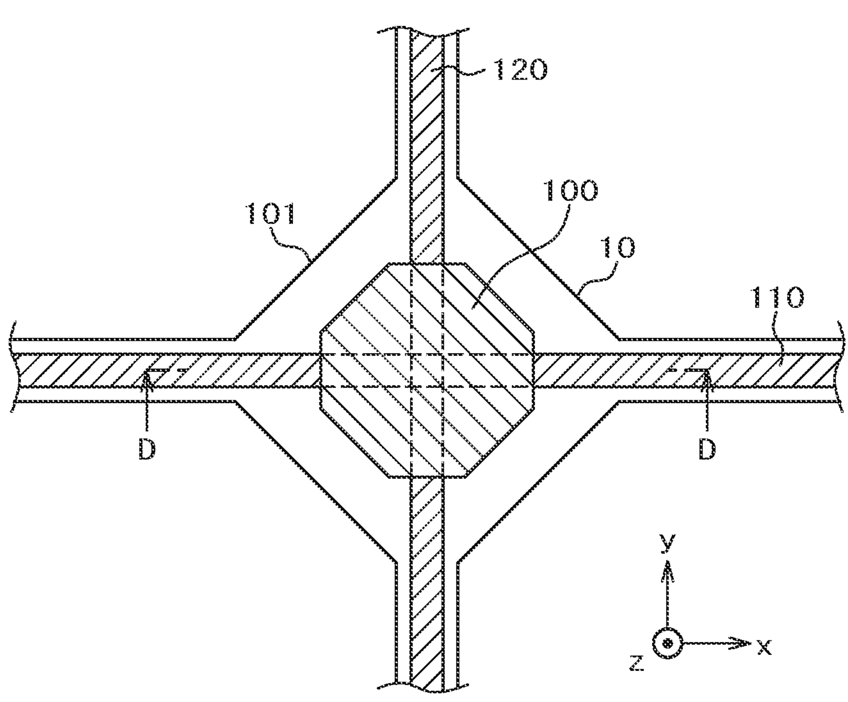
F I G . 7
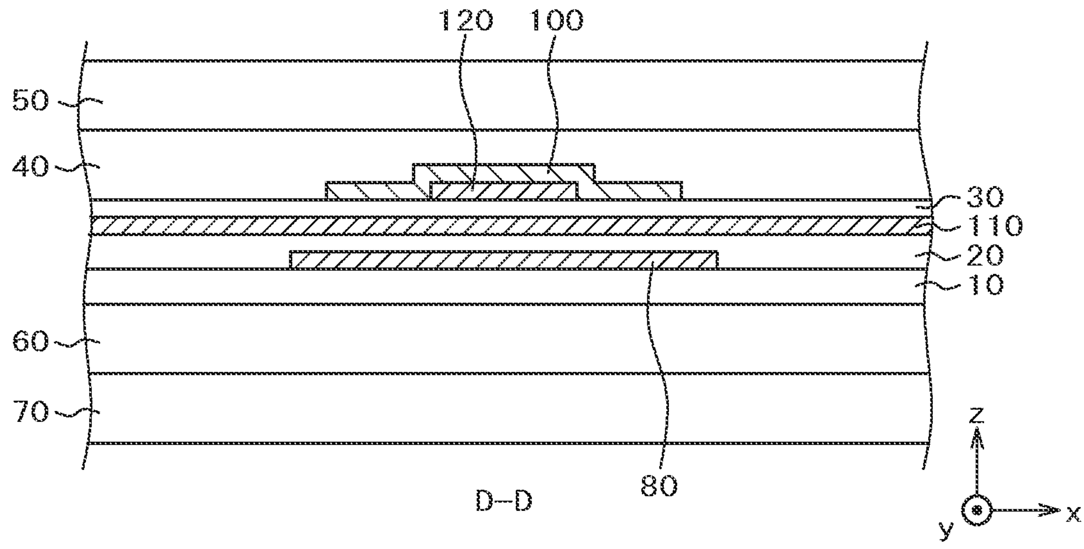

E-E

F-F

G-G

H–H

I–I

S-S

ELECTRONIC DEVICE

CLAIM OF PRIORITY

The present application claims priority from Japanese Patent Application JP 2023-3665 filed on Jan. 13, 2023, the content of which is hereby incorporated by reference into this application.

BACKGROUND OF THE INVENTION

1. Field of the Invention

The present invention relates to a flexible and stretchable electronic device.

2. Description of the Related Art

The demand for flexible or stretchable electronic devices has been increasing. Applications of such a stretchable electronic device include, for example, pasting it to the housing of an electronic apparatus having a curved surface, attaching it to a display medium having a curved surface, and attaching it to a human body or the like as a sensor. Elements include, for example, sensors such as a touch sensor, a temperature sensor, a pressure sensor, and an acceleration sensor, or light emitting elements, and light valves that configure various display devices.

In a sensor device, scanning lines and signal lines are used to control each element. It is necessary for a stretchable electronic device to be resistant to bending and stretching. Japanese Patent Laid-open No. 2021-106199 describes a configuration resistant to bending and stretching by meandering scanning lines and video signal lines (hereinafter, also referred to as a meander structure).

SUMMARY OF THE INVENTION

By allowing scanning lines and signal lines to have a meander structure, a certain degree of resistance to stretching or bending the stretchable electronic device can be obtained. Even for a stretchable display device, power and signals need to be supplied from the outside. Such supply of power and signals is performed through a flexible wiring substrate.

Incidentally, the flexible wiring substrate can be flexibly bent, but cannot be expected to be stretched. Thus, if the stretchable electronic device is stretched, stress is generated between the flexible wiring substrate and the display device. In addition, the flexible wiring substrate is often used while being bent, and when being bent, stress is likely to be generated between the flexible wiring substrate and the stretchable electronic device.

The connection between the flexible wiring substrate and the stretchable display device is made through a plurality of terminals. Therefore, this stress is generated at the terminals. When the stress increases, the terminals are peeled off. In addition, even in the case where the peel-off does not occur, connection resistance at the terminals becomes large. The change in connection resistance is observed as noise.

An object of the present invention is to avoid stress at a connection part between a flexible wiring substrate and a stretchable electronic device, and to prevent connection failure or noise from being generated at the connection part. in addition, the present invention realizes a highly-reliable and stretchable electronic device.

The present invention realizes the above object, and representative means is as follows.

(1) In a stretchable electronic device in which an active area and a terminal area are continuously formed, a scanning line having a meander structure and a signal line having a meander structure are formed in the active area, terminal wirings and terminals are formed on a base material extending in a second direction and aligned in a first direction in the terminal area, and the base material continues in the first direction in the part where the terminal is formed.

(2) In a stretchable electronic device in which an active area and a terminal area are continuously formed, a scanning line having a meander structure and a signal line having a meander structure are formed in the active area, terminal wirings and terminals are formed on a base material extending in a second direction and aligned in a first direction in the terminal area, the base material is formed on a first substrate, and a first layer is formed on the surface of the substrate opposite to the surface on which the base material is formed by using a material having a larger Young's modulus than the substrate at a part corresponding to the terminal.

BRIEF DESCRIPTION OF THE DRAWINGS

FIG. 6 is a plan view for depicting an element and surroundings thereof;

FIG. 7 is a D-D cross-sectional view of FIG. 6;

DETAILED DESCRIPTION OF THE PREFERRED EMBODIMENTS

The content of the present invention will be described below in detail using embodiments. Hereinafter, an electronic device that is stretchable will also be referred to as a stretchable electronic device.

First Embodiment

Figure 1:
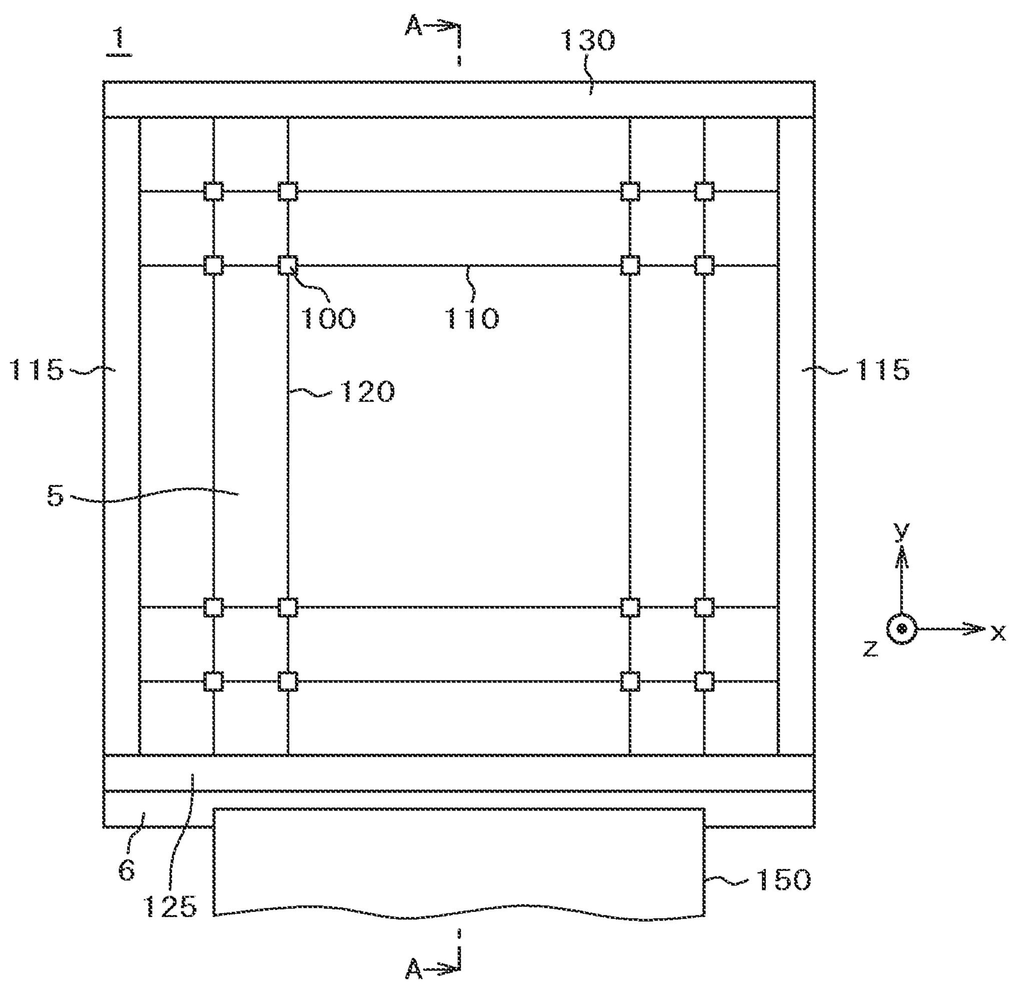
FIG. 1 is a plan view of a stretchable electronic device as a comparative example.

The present invention particularly relates to a configuration of a terminal area of a stretchable electronic device, but since a terminal area 6 is formed at the same time as an active area 5, a configuration of the active area 5 will be described first. FIG. 1 is a plan view of a stretchable electronic device 1 to describe the configuration of the active area 5. The active areas 5 in the comparative example and the embodiments described later have almost the similar configuration. The stretchable electronic device 1 in FIG. 1 is formed in a flat plate shape as a whole, but can be curved in the z direction or extended on the x-y plane. The break elongation rate, that is, the elongation rate until the stretchable electronic device 1 breaks is different depending on the materials that configure the stretchable electronic device 1, but in the case where extensible organic materials are mainly used, an elongation rate of approximately 30% is possible, or an elongation rate of approximately 60% is also possible in some cases. On the other hand, if relatively large amounts of inorganic materials are used, the elongation rate is approximately 10% to 15%.

In FIG. 1, the stretchable electronic device 1 has a large area occupied by the active area 5. In the active area 5, electronic elements 100 are arranged in a matrix. As the electronic elements 100, a sensor, a semiconductor element, an actuator, and the like can be arranged. As the sensor, for example, a light sensor for detecting visible or infrared light, a temperature sensor, a pressure sensor, or a touch sensor can be arranged. As the semiconductor element, for example, a light emitting element, a light receiving element, a diode, or a transistor can be arranged. As the actuator, for example, a piezo element can be used.

Figure 3:
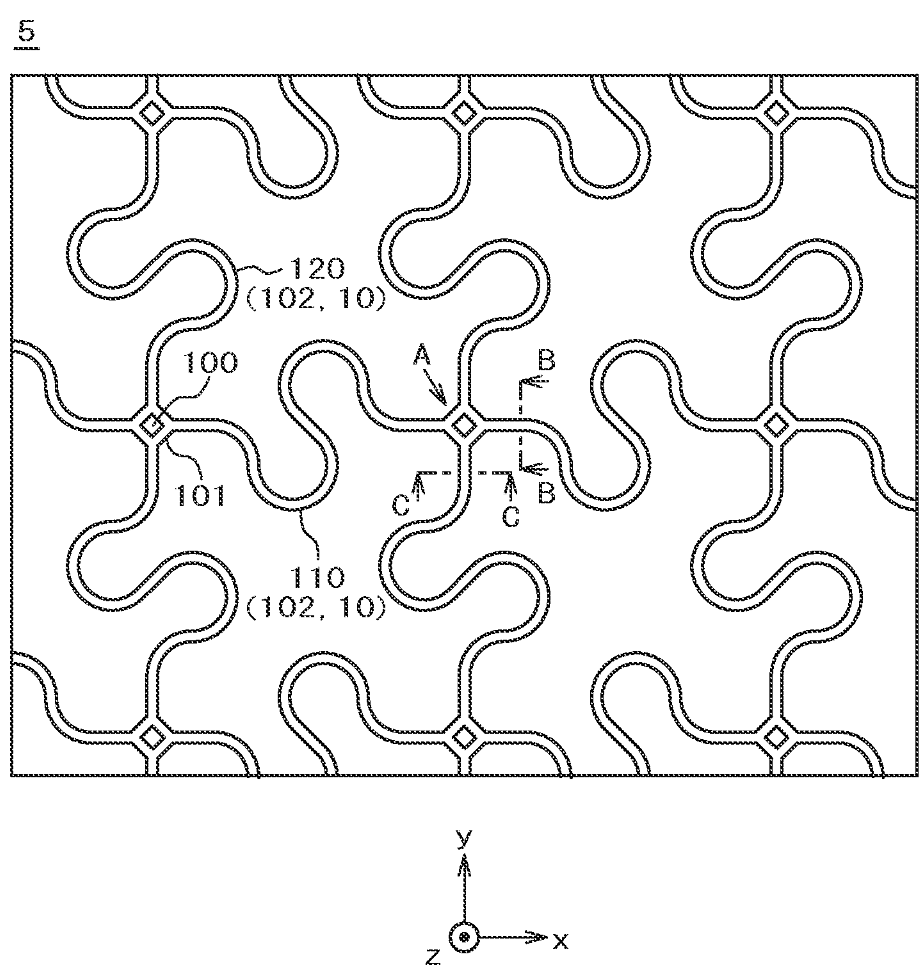
FIG. 3 is an enlarged plan view of an active area.

Each electronic element 100 is connected to a scanning line 110 and a signal line 120. The scanning lines 110 extend in the lateral direction (x direction) and are aligned in the vertical direction (y direction), and the signal lines 120 extend in the vertical direction and are aligned in the lateral direction. In FIG. 1, both the scanning lines 110 and the signal lines 120 linearly extend in order not to complicate the drawing, but in reality, the scanning lines 110 extend in the lateral direction in a meandering manner, and the signal lines 120 extend in the vertical direction as depicted in FIG. 3.

In FIG. 1, driving circuits 115 and 125 and the terminal area 6 are arranged outside the active area 5. Scanning line driving circuits 115 are arranged on both sides of the active area 5 in the x direction, a power supply circuit 130 for supplying power to the electronic elements 100 is present on the upper side of the active area 5 in the y direction, and a signal line driving circuit 125 is arranged on the lower side of the active area 5 in the y direction. The terminal area 6 is arranged further below the signal line driving circuit 125. A flexible wiring substrate 150 for supplying power and signals to the stretchable electronic device 1 and for sending signals to the outside is connected to the terminal area 6. It should be noted that although not depicted, the flexible wiring substrate 150 is further connected to another wiring substrate.

Figure 2:
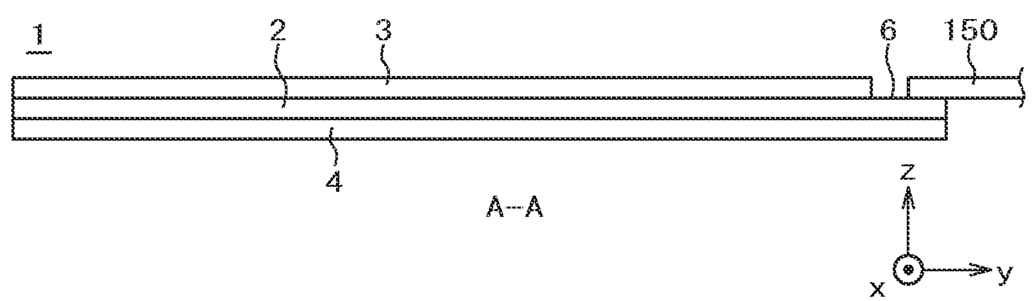
FIG. 2 is an A-A cross-sectional view of FIG. 1.

FIG. 2 is an A-A cross-sectional view of FIG. 1. FIG. 2 is a schematic cross-sectional view. In FIG. 2, the electronic elements 100, the scanning lines 110, the signal lines 120, and the like described in FIG. 1 are present in an element layer 2. That is, the function as the stretchable electronic device 1 is present in the element layer 2. This element layer 2 is covered with an upper protective layer 3 from the upper side and a lower protective layer 4 from the lower side. Both the upper protective layer 3 and the lower protective layer 4 are formed of a material that can be elastically deformed, that is, small in Young's modulus.

In FIG. 2, the active area 5, the driving circuits 115 and 125, and the like are covered with the upper protective layer 3 and the lower protective layer 4. At an end of the element layer 2, there is a portion that is not covered with the upper protective layer 3, and this portion is the terminal area 6. The terminal area 6 is protected only by the lower protective layer 4. The flexible wiring substrate 150 is connected to the terminal area 6.

FIG. 3 is an enlarged plan view of the active area 5. FIG. 3 depicts the main constitutional parts of the element layer 2 depicted in FIG. 2. That is, the element layer 2 depicted in FIG. 2 is not present as a single planar substrate, but is, as depicted in FIG. 3, configured using a meander structural part 102 where the scanning line 110 and the signal line 120 are formed, and a base material 10 where an element area 101 formed at the intersection of the scanning line 110 and the signal line 120 is present. In other words, the base material 10 has a net-like structure.

In FIG. 3, the meander structural part 102 and the element area 101 present at the intersection are made of resin such as polyimide. Using this resin as the base material 10, the scanning lines 110, the signal lines 120, the elements 100, and the like are formed thereon. In FIG. 3, the element 100 is present in the element area 101. This configuration is intended to reduce the stress on each component even when the stretchable electronic device 1 is stretched.

In FIG. 3, the diameter of the element 100 in the x direction and the diameter in the y direction are, for example, 100 μm. The pitch of the element 100 in the x direction and the pitch in the y direction are, for example, 250 μm. In addition, the width of the base material 10 including the scanning line 110, the video signal line 120, and the like in the meander structural part 102 is, for example, 30 μm.

Figure 4:
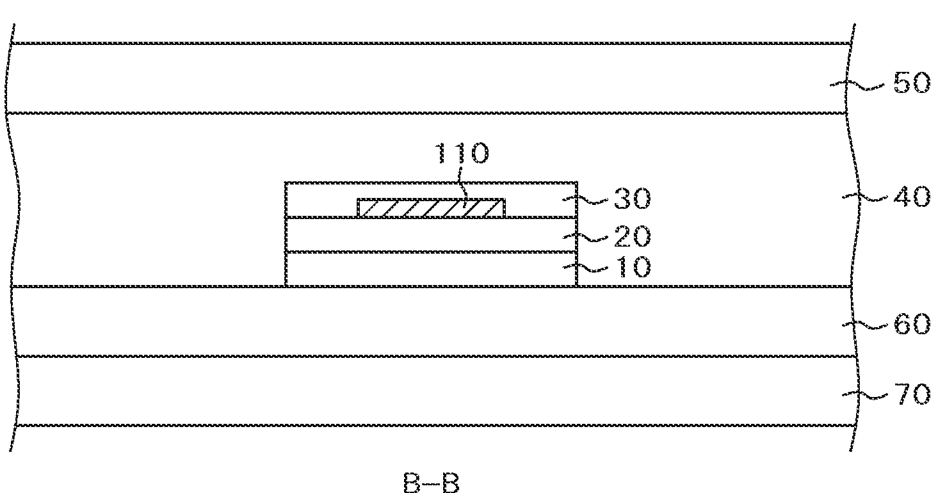
FIG. 4 is a B-B cross-sectional view of FIG. 3.

FIG. 4 is a B-B cross-sectional view of FIG. 3 and a cross-sectional view of the meander structural part 102 including the scanning line 110. In FIG. 4, a first organic insulating film 20 is formed on the base material 10. The scanning line 110 is formed on the first organic insulating film 20. A second organic insulating film 30 is formed by covering the scanning line 110. The plan view of the meander structural part 102 including the scanning line 110 in FIG. 3 depicts the planar shape of the base material 10.

The base material 10, the first organic insulating film 20, and the second organic insulating film 30 are formed of, for example, polyimide. Polyimide is preferable as the base material 10 of the scanning line 110 and the signal line 120 because of excellent performance in mechanical strength, heat resistance, and the like. That is, in the case where the stretchable electronic device 1 is stretched, the stress generated in the meander structural part 102 is received by polyimide forming the base material 10, the first organic insulating film 20, and the like, and thus the stress on the scanning line 110 and the like formed of metal is reduced.

The scanning line 110 has, for example, a titanium-aluminum-titanium (Ti—Al—Ti, TAT) structure. In the three-layer structure, the conductivity is mainly assumed by Al, and Ti is used to protect Al or improve bonding with other wirings. In addition to this, the material of the scanning line 110 can be variously configured depending on the application of the stretchable electronic device 1, such as molybdenum-tungsten alloy (MoW).

As depicted in FIG. 3, the meander structural part 102 (hereinafter, also simply referred to as the scanning line 110) having the scanning line 110 is fixed by the protective layers (3 and 4 depicted in FIG. 2) from the top and bottom because the shape is unstable. First, the meander structural part 102 with the scanning line 110 formed is covered with an upper buffer layer 40 formed of an organic material. The upper side thereof is covered with a protective layer 50 formed of an organic material. A lower buffer layer 60 formed of an organic material is arranged on the lower surface of the base material 10, and a lower protective layer 70 made of an organic material is formed thereunder.

As described above, the buffer layers 40 and 60 and the protective layers 50 and 70 arranged above and below stabilize the shape. Incidentally, since the electronic device of the present invention is a stretchable electronic device, it is necessary to be stretchable against external tensile stress. Therefore, the buffer layers 40 and 60 and the protective layers 50 and 70 sandwiching the meander structural part 102 are desirably made of materials that are easier to extend than polyimide forming the base material 10, the first organic insulating film 20, and the like, that is, materials that are small in Young's modulus. Such materials include resin such as acrylic, urethane, epoxy, and silicone.

Figure 5:
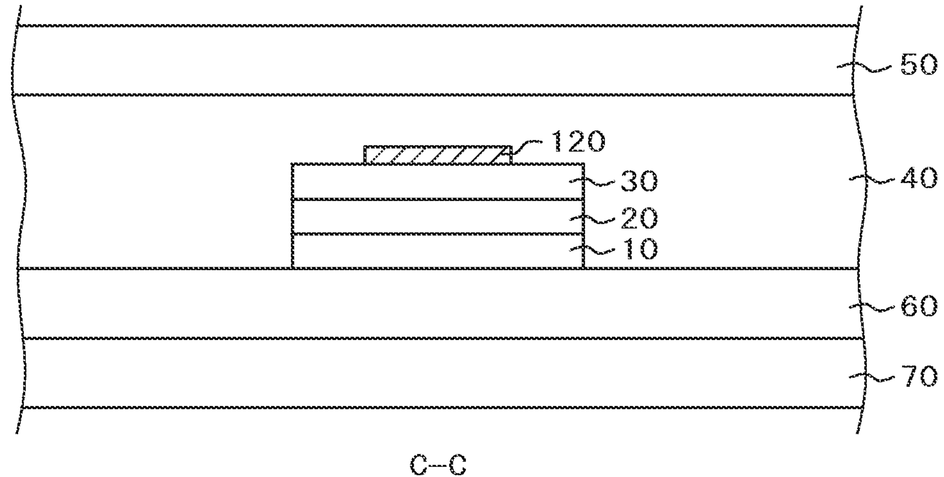
FIG. 5 is a C-C cross-sectional view of FIG. 3.

FIG. 5 is a C-C cross-sectional view of FIG. 3 and a cross-sectional view of the meander structural part 102 having the signal line 120. In the meander structural part 102 of FIG. 5, the first organic insulating film 20 and the second organic insulating film 30 are continuously formed on the base material 10. The signal line 120 is formed on the second organic insulating film 30. In the first embodiment, the signal line 120 has the same material as the scanning line, that is, the Ti—Al—Ti (TAT) structure, but may be changed to other materials depending on the application of the stretchable electronic device. The other structures are the same as the cross-sectional shape of the scanning line 110 part described in FIG. 4.

FIG. 6 is an enlarged plan view of the element area 101. The element area 101 consists of the base material 10 formed in an island shape. The element area 101 in FIG. 6 is roughly shaped like an octagon, but other shapes may be used. In FIG. 6, both the scanning line 110 and the signal line 120 are straight lines, but have the meander structure as depicted in FIG. 3 on the outer side of FIG. 6.

In FIG. 6, the element 100 is arranged in the element area 101. In the element area 101, the signal line 120 and the scanning line 110 intersect with each other through an insulating film. However, FIG. 6 is a schematic diagram, and in an actual device, both the scanning line 110 and the video signal line 120 are connected to a transistor or the like that drives the element 100.

FIG. 7 is a D-D cross-sectional view of FIG. 6. In FIG. 7, an inorganic insulating film 80 is formed on the base material 10. The inorganic insulating film 80 blocks impurities and the like entering from the lower side to the element 100 and the like formed on the upper side thereof. In FIG. 7, the inorganic insulating film 80 is formed on the base material 10, but this is an example and may be formed in a layer closer to the element 100 as needed.

The inorganic insulating film 80 is formed of a silicon nitride film (SiN film), a silicon oxide film (SiO film), or a laminated film of these. In some cases, an aluminum oxide film (AlO) is used. Since the inorganic insulating film 80 is high in rigidity but is formed only in the element area 101, it has a small effect on the stretchability of the stretchable electronic device 1.

The first organic insulating film 20 made of, for example, polyimide is formed by covering the inorganic insulating film 80. The scanning line 110 extends in the lateral direction (x direction) on the first organic insulating film 20. The second organic insulating film 30 made of, for example, polyimide is formed by covering the scanning line 110 and the first organic insulating film 20. The signal line 120 extends in the y direction on the second organic insulating film 30.

Then, the element 100 is arranged by covering the signal line 120. FIG. 7 is a schematic diagram, and the connection structures among the element 100 and the scanning line 110, the signal line 120, and the like are omitted. As an example, a thin-film transistor (TFT) is arranged between the element 100 and the scanning line 110 or the signal line 120, and signals from the element 100 or signals to the element 100 are controlled by controlling the thin-film transistor with a scanning line control circuit 115 and a signal line control circuit 125.

The wiring structure between the element 100 and the signal line 120 in FIG. 7 differs depending on what is arranged as the element 100 in FIG. 7. There is a possibility that a plurality of organic or inorganic insulating films is formed in the element area 101.

The planar structure depicted in FIG. 6 corresponds to the cross-sectional structure from the base material 10 to the element 100 in FIG. 7. If the structure is as it is, the plane shape becomes as depicted in FIG. 3 and is unstable. Therefore, as described in FIG. 4, the upper buffer layer 40, the upper protective layer 50, the lower buffer layer 60, and the lower protective layer 70 are formed, and the entire structure is consolidated into a flat plate to stabilize the shape. In addition, as described in FIG. 4, since the materials that are smaller in Young's modulus than the base material 10, the first organic insulating film 20, the second organic insulating film 30, and the like are used for the upper buffer layer 40, the upper protective layer 50, the lower buffer layer 60, and the lower protective layer 70, the stretchable electronic device 1 is configured not to impair the stretchability.

Figure 8:
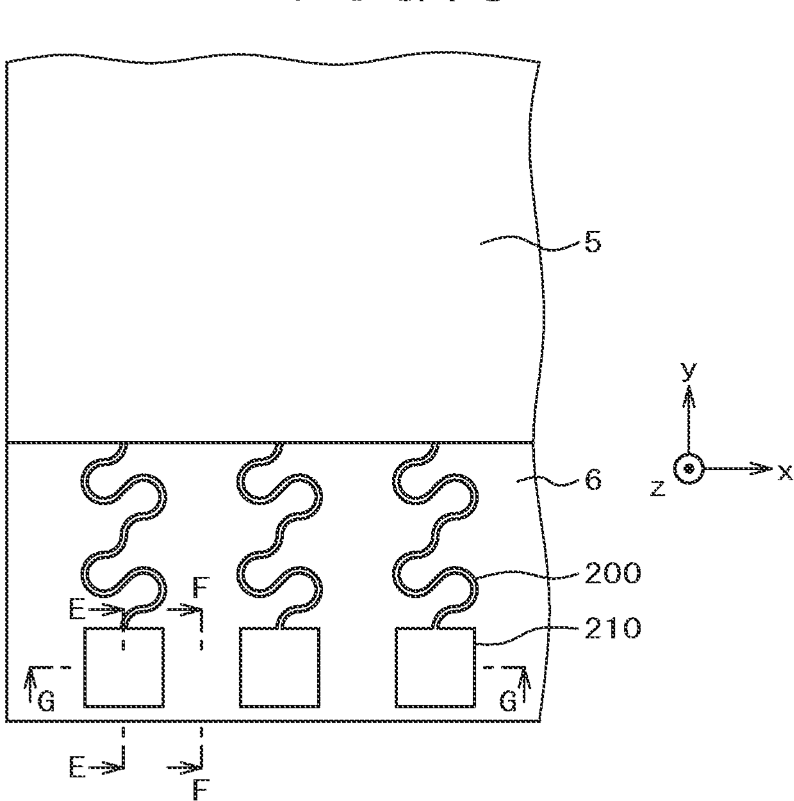
FIG. 8 is a plan view of a stretchable electronic device as the comparative example.

FIG. 8 is a detailed plan view of a terminal area 6 of a stretchable electronic device 1 according to a comparative example. In FIG. 8, the configuration of an active area 5 is the same as that described in FIG. 1 to FIG. 7. In FIG. 8, terminal wirings 200 extend in the vertical direction (y direction) as similar to signal lines 120 of the active area 5. In the lower end of the terminal area 6, a plurality of terminals 210 is aligned in the lateral direction (x direction).

Figure 9:
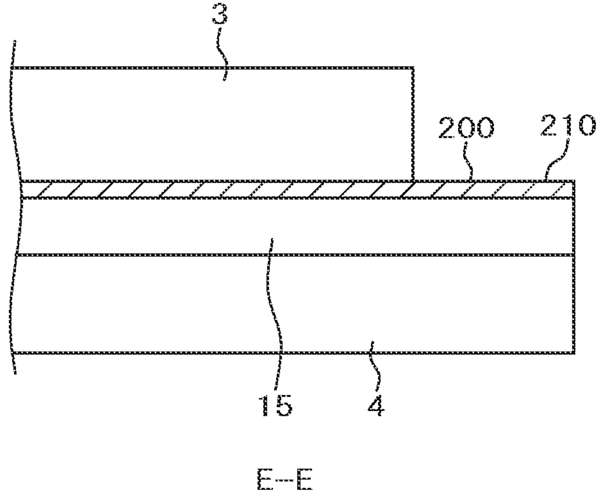
FIG. 9 is an E-E cross-sectional view of FIG. 8.

FIG. 9 is an E-E cross-sectional view of FIG. 8. In FIG. 9, the upper buffer layer 40 and the upper protective film 50 described in the active area 5 are collectively described as an upper protective layer 3. In addition, the lower buffer layer 60 and the lower protective film 70 are collectively described as a lower protective layer 4. Further, the base material 10, the first organic insulating film 20, and the second organic insulating film 30 are collectively described as a base material 15. The same applies to the following drawings. As depicted in FIG. 9, in the part where the terminal wiring 200 and the terminal 210 are present, the base material 15 is present up to the end.

Figure 10:
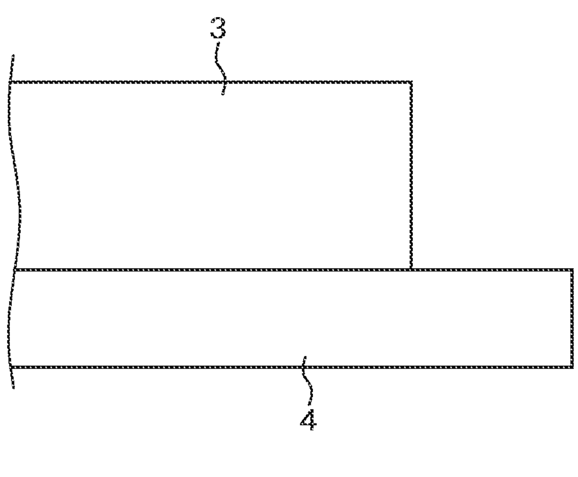
FIG. 10 is an F-F cross-sectional view of FIG. 8.
Figure 11:
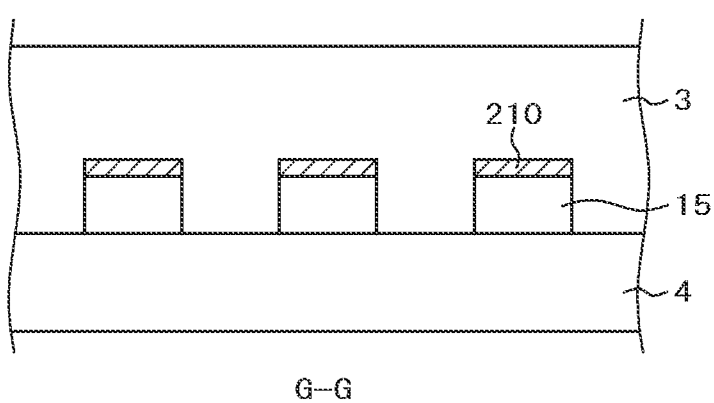
FIG. 11 is a G-G cross-sectional view of FIG. 8.

FIG. 10 is an F-F cross-sectional view of FIG. 8. As depicted in FIG. 10, even in the terminal area 6, the base material 15 is not present in the part where the terminal wiring 200 and the terminal 210 are not present. This is to maintain the stretchable structure even in the terminal area 6. FIG. 11 is a G-G cross-sectional view of FIG. 8. In FIG. 11, the base material 15 is present only in the part where the terminal 210 is present.

Figure 12:
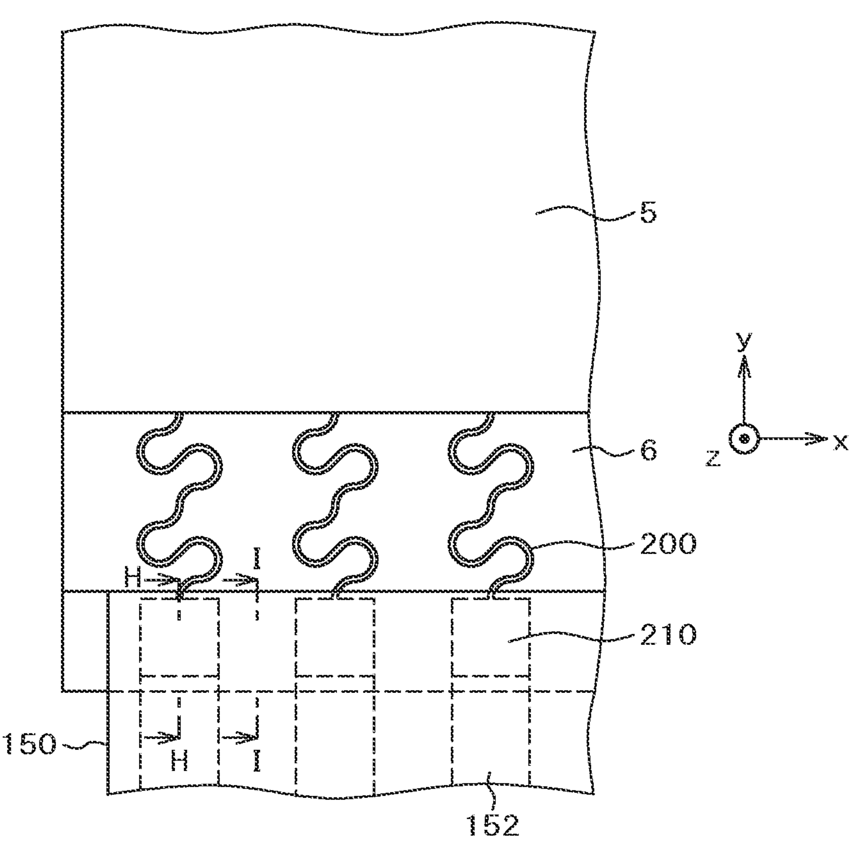
FIG. 12 is a plan view for depicting a state in which a flexible wiring substrate is connected to the stretchable electronic device of FIG. 8.

FIG. 12 is a plan view for depicting a state in which a flexible wiring substrate 150 is connected to the terminal area 6 depicted in FIG. 8. In FIG. 12, the terminal 210 of the terminal area 6 is connected to a wiring 152 of the flexible wiring substrate.

Figure 13:
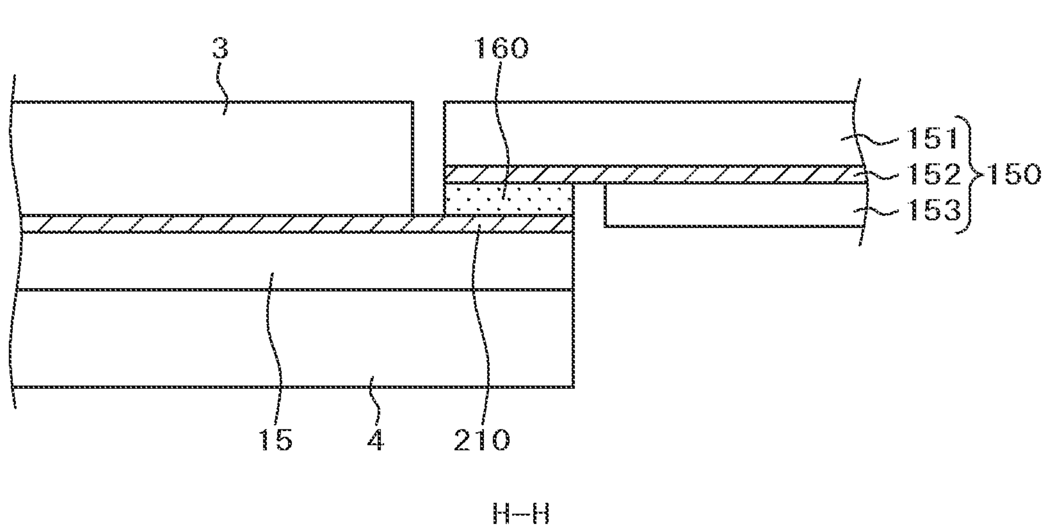
FIG. 13 is an H-H cross-sectional view of FIG. 12.

FIG. 13 is an H-H cross-sectional view of FIG. 12. In FIG. 13, the flexible wiring substrate 150 is schematically configured using a base material 151, the wiring 152, and an overcoat film 153. In FIG. 13, the terminal 210 of the terminal area 6 and the wiring 152 of the flexible wiring substrate 150 are connected to each other by using an anisotropic conductive film (ACF) 160.

Figure 14:
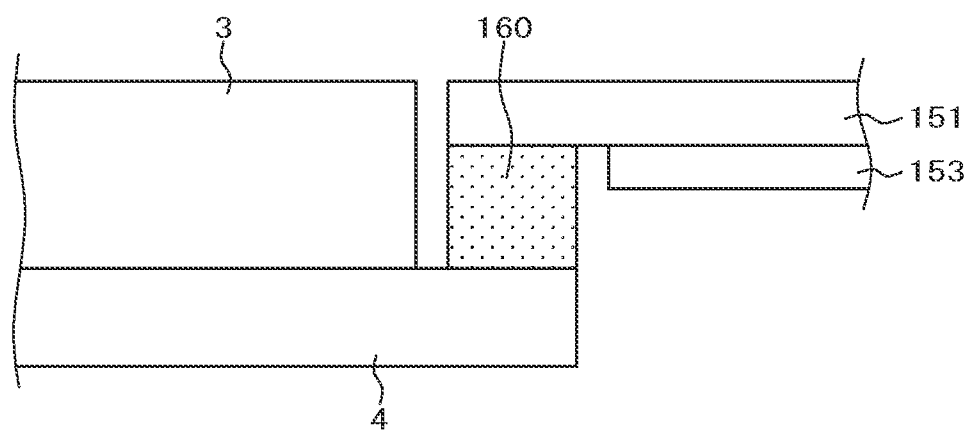
FIG. 14 is an I-I cross-sectional view of FIG. 12.

FIG. 14 is an I-I cross-sectional view of FIG. 14. In this part, since the terminal wiring 200 and the terminal 210 are not present in the terminal area 6, the wiring 152 is not present even in the corresponding flexible wiring substrate 150. However, the ACF 160 is present for bonding the flexible wiring substrate 150 and the terminal area 6 to each other.

As depicted in FIG. 12, in the terminal area 6 of the stretchable electronic device 1, the base material 15 formed of polyimide that is harder than other organic materials is described only in the part where the wirings 200 having a meander structure and the terminals 210 are formed, as similar to that described in the active area 5. On the other hand, the flexible wiring substrate 150 does not have such a structure, and the entire surface of the base material 151 is formed of polyimide. Then, the difference in extensibility between the terminal area 6 and the flexible wiring substrate 150 becomes extremely large especially in the lateral direction (x direction).

That is, in the case where the stretchable electronic device 1 is extended, stress is generated between the terminal area 6 and the flexible wiring substrate 150 especially in the lateral direction (x direction). This stress is concentrated between the wirings 152 of the flexible wiring substrate 150 and the terminals 210 of the terminal area 6. Then, the connection between the flexible wiring substrate 150 and the stretchable electronic device 1 becomes unstable, which affects the reliability.

Figure 15:
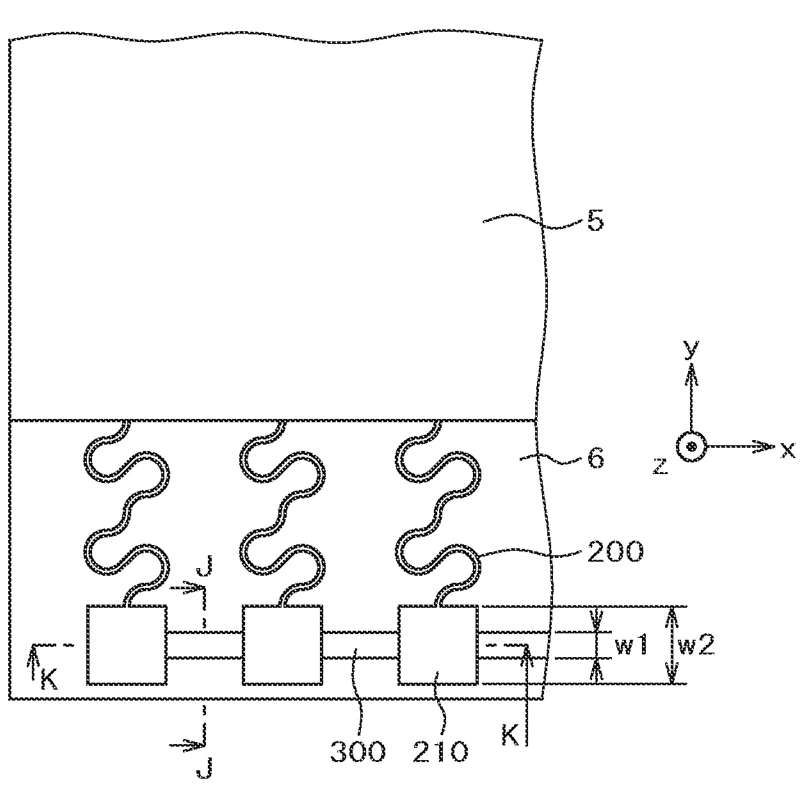
FIG. 15 is a plan view of the stretchable electronic device of a first embodiment.

The present invention is to take countermeasures against this problem. FIG. 15 is a plan view for depicting a configuration of the terminal area 6 in the first embodiment. The difference between FIG. 15 and FIG. 8 that is a comparative example is that a connecting part 300 is formed to connect between the terminals 210.

In FIG. 15, the connecting part 300 is formed of the same material as the base material 15. That is, the number of processes does not increase because it can be formed at the same time when the base material 15 is formed.

In FIG. 15, the width w1 of the connecting part 300 in the vertical direction (y direction) is smaller than the width w2 of the terminal 210 in the vertical direction (y direction). However, the present invention is not limited to this, and the width w1 of the connecting part 300 in the vertical direction (y direction) may be adjusted in consideration of the extensibility of the terminal area 6 in the lateral direction (x direction). For example, the preferable range of the width w1 of the connecting part 300 in the vertical direction (y direction) is 3 μm or more and equal to or smaller than the width w2 of the terminal 210 in the vertical direction (y direction). Incidentally, extensibility can also be expressed by the magnitude of the Young's modulus. That is, the Young's modulus of the terminal 210 part in the lateral direction (x direction) in the terminal area 6 can be adjusted by the width of the connecting part 300.

Figure 16:
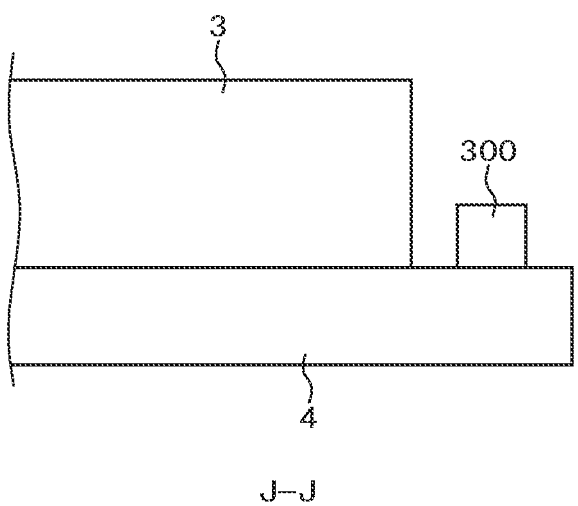
FIG. 16 is a J-J cross-sectional view of FIG. 15.
Figure 17:
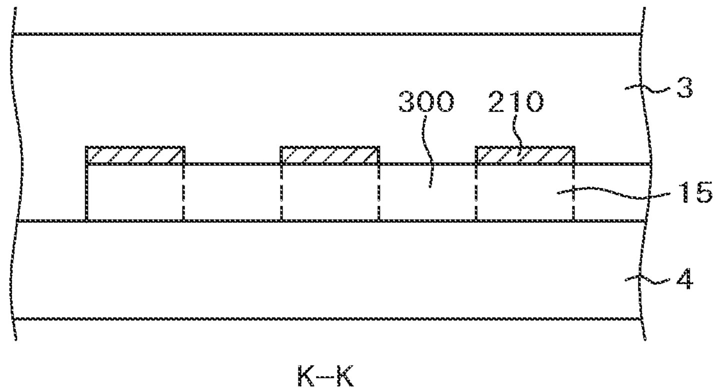
FIG. 17 is a K-K cross-sectional view of FIG. 15.

FIG. 16 is a J-J cross-sectional view of FIG. 15. FIG. 17 is a K-K cross-sectional view of FIG. 15. In FIG. 17, since the base material 15 and the connecting part 300 are continuously formed of the same polyimide, no boundary exists in reality, but they are distinguished from each other by dotted lines in FIG. 17 for easily understanding the drawing. The terminal 210 is formed only on the base material 15.

Figure 18:
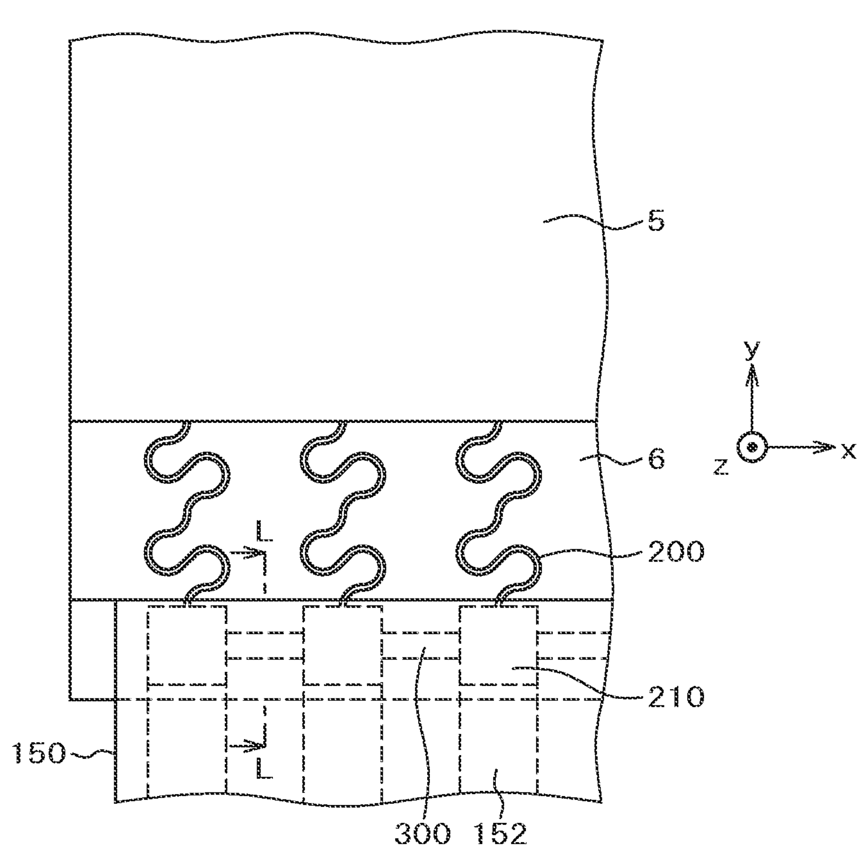
FIG. 18 is a plan view for depicting a state in which a flexible wiring substrate is connected to the stretchable electronic device of FIG. 15.

FIG. 18 is a plan view for depicting a state in which the flexible wiring substrate 150 is connected to the terminal area 6 of FIG. 15. The basic configuration of FIG. 18 is the same as that described in FIG. 15. That is, the connection part between the terminal 210 and the flexible wiring substrate 150 is the same as the H-H cross section of FIG. 12. In FIG. 18, the L-L cross-sectional view is different from the configuration of FIG. 12.

Figure 19:
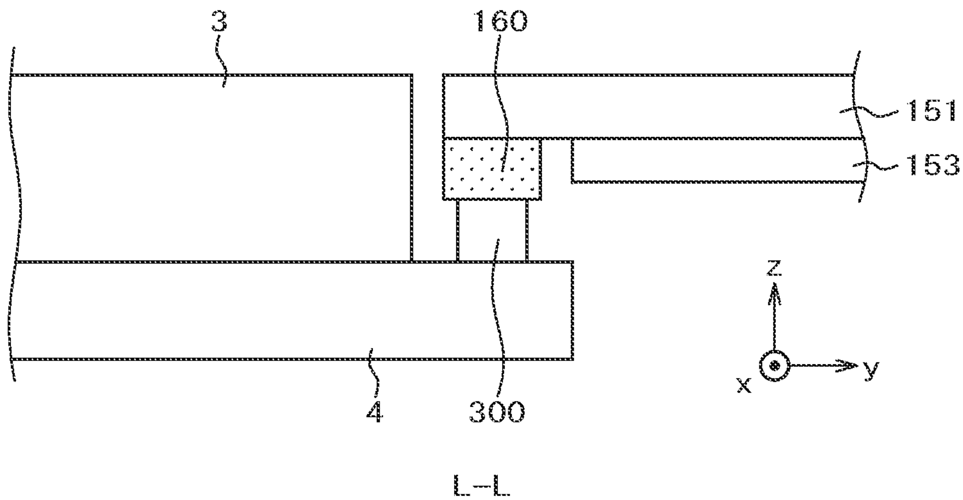
FIG. 19 is an L-L cross-sectional view of FIG. 18.

FIG. 19 is an L-L cross-sectional view of FIG. 18. This part is a part where the terminal wiring 200 and the terminal 210 are not present. In FIG. 19, the ACF 160 connects the connecting part 300 and the base material 151 of the flexible wiring substrate 150 to each other. The presence of the connecting part 300 reduces the difference in Young's modulus between the flexible wiring substrate 150 and the terminal 210 in the terminal area 6 of the stretchable electronic device 1 in the lateral direction (x direction) in FIG. 19.

Figure 20:
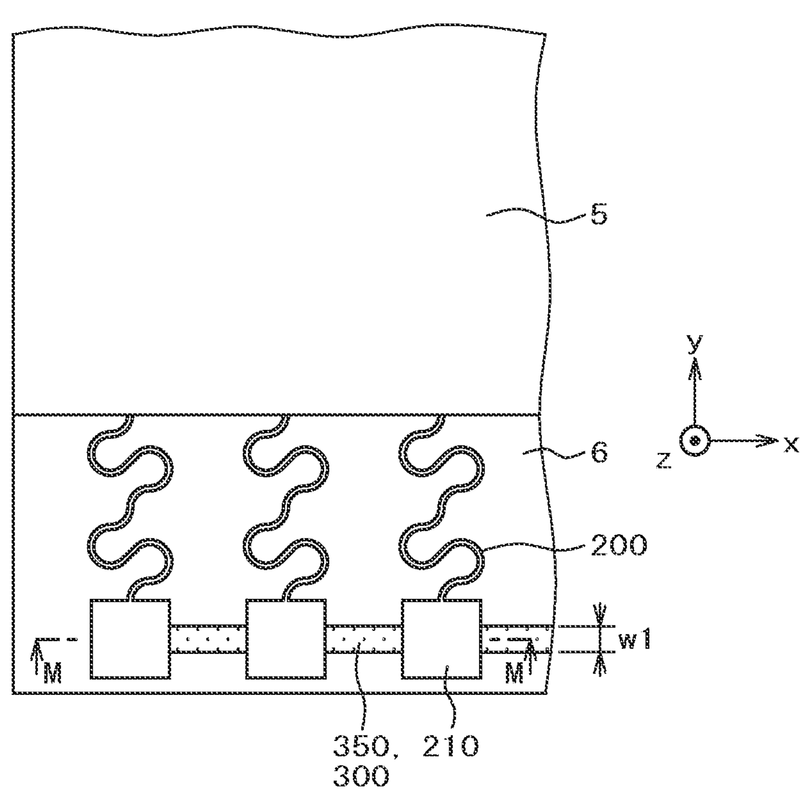
FIG. 20 is a plan view for depicting a second mode of the first embodiment.

FIG. 20 is a plan view of the terminal area 6 depicting another mode of the first embodiment. The difference between FIG. 20 and FIG. 15 is that a second connecting part 350 is formed between the terminal 210 and the terminal 210 in addition to the connecting part 300. It should be noted that since the second connecting part 350 is formed between the terminal 210 and the terminal 210, it can also be referred to as a bridge layer 350. It should be noted that in FIG. 20, the width w1 of the connecting parts 300 and 350 may also be adjusted such that the terminal 210 part of the terminal area 6 has a predetermined Young's modulus.

Figure 21:
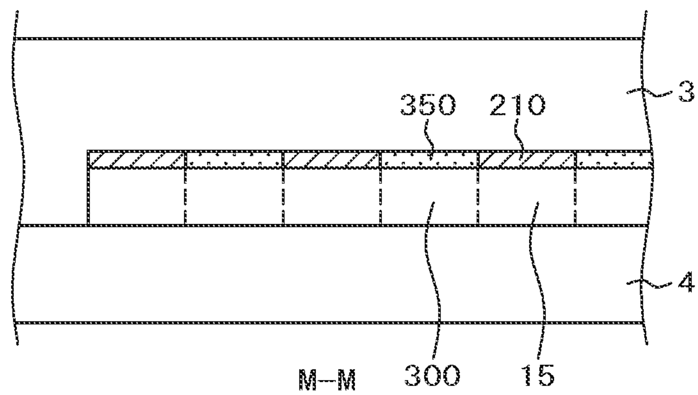
FIG. 21 is an M-M cross-sectional view of FIG. 20.

FIG. 21 is an M-M cross-sectional view of FIG. 20. In FIG. 21, the second connecting part 350 is formed on the connecting part 300. The material of the second connecting part 350 may be any material as long as it is an insulator. For example, an inorganic film such as SiO or SiN may be used to effectively adjust the tensile strength in the lateral direction (x direction). In addition, since the second connecting part 350 uses a harder material than the base material 15, the thickness thereof may be thinner than that of the base material 15.

Figure 22:
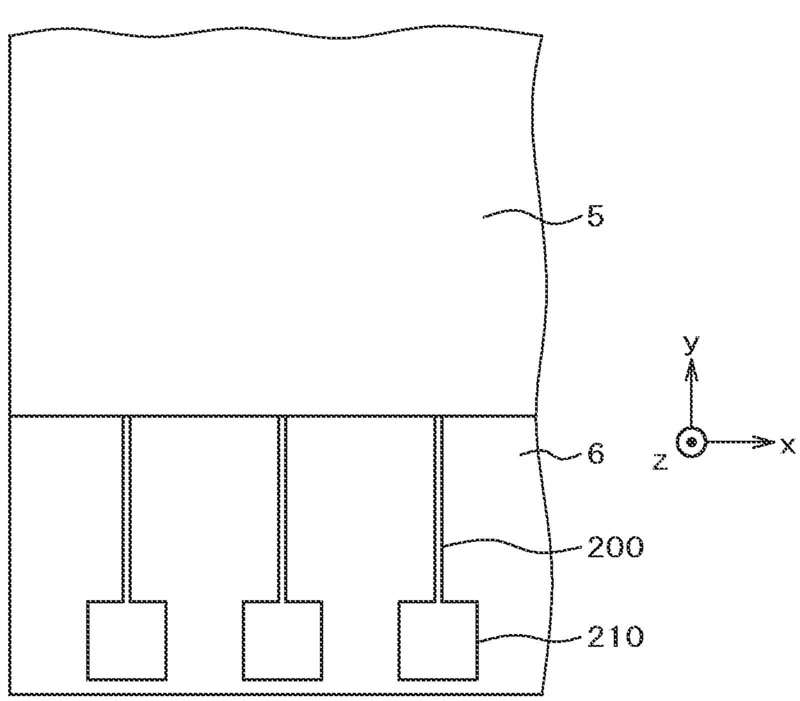
FIG. 22 is a plan view of a stretchable electronic device according to a second comparative example.

The extensibility of the terminal area 6 of the stretchable electronic device 1 in the vertical direction (y direction) may be small in some cases. In this case, the terminal wirings 200 are made linear in the terminal area 6 in some cases. FIG. 22 is a plan view for depicting this example. In FIG. 22, although the scanning lines 110, the signal lines 120, and the like in the active area 5 have a meander structure, the terminal wirings 200 are straight lines in the vertical direction (y direction). However, in order to maintain the stretchable structure in the lateral direction (x direction), the base material 15 is formed only under the terminal wirings 200 and the terminals 210. Then, the same problem as described in FIG. 8 to FIG. 14 arises.

Figure 23:
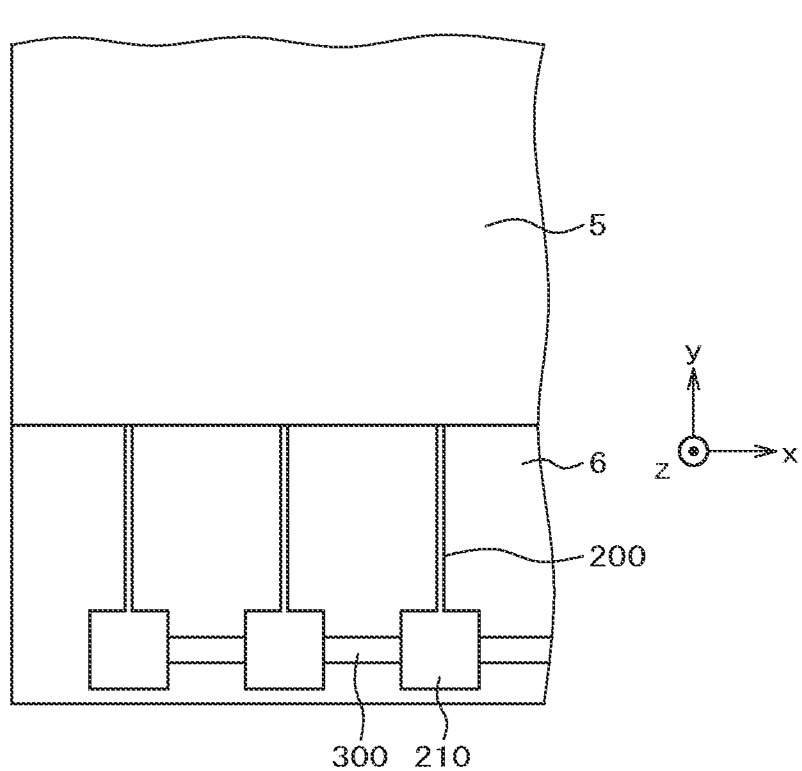
FIG. 23 is a plan view for depicting a third mode of the first embodiment.

However, in the lateral direction (x direction), the problem of stress at the terminal 210 caused by the extensibility of the terminal area 6 and the flexible wiring substrate 150 is the same as the case where the terminal wirings 200 have a meander structure and the case where the terminal wirings 200 have a linear structure. FIG. 23 is a plan view in the case where the configuration of FIG. 15 is applied to the case where the terminal wirings 200 are straight lines. The connecting part 300 and other configurations are the same as those in FIG. 15. As described above, by the same configuration as described in FIG. 15 to FIG. 21, it is possible to take countermeasures against the stress at the terminal 210 even in the configuration of FIG. 23.

Second Embodiment

Figure 24:
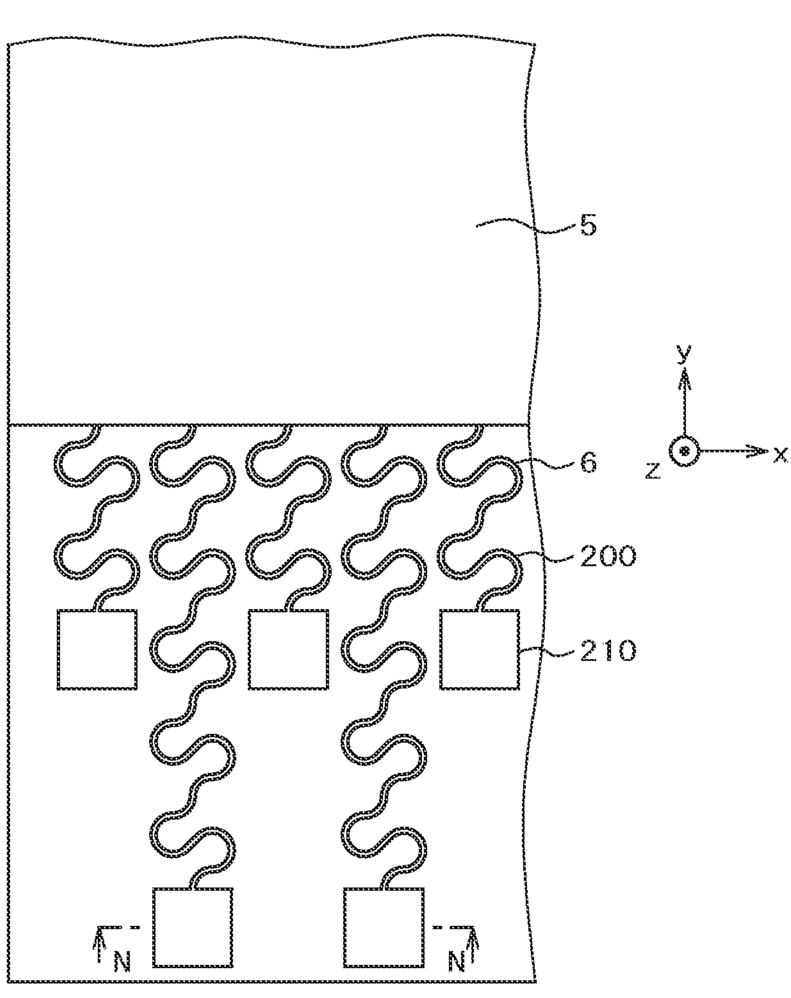
FIG. 24 is a plan view of a stretchable electronic device according to a third comparative example.
Figure 25:
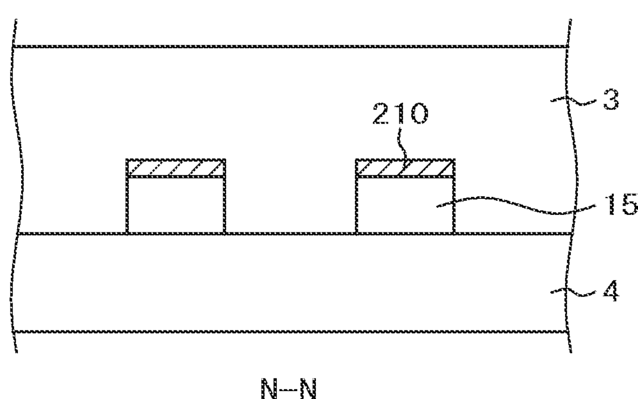
FIG. 25 is an N-N cross-sectional view of FIG. 24.

When the density of the terminal wirings 200 increases, the terminals 210 are arranged in a plurality of lines in some cases. FIG. 24 is a plan view of a structure in which the terminal wirings 200 are arranged in a meander structure and the terminals 210 are arranged in two lines. FIG. 25 is an N-N cross-sectional view of FIG. 24. FIG. 25 has the same configuration as FIG. 11 in the first embodiment. On the other hand, the terminal arrangement of the flexible wiring substrate to be connected to FIG. 24 is also two-row arrangement as similar to FIG. 24. Therefore, the configuration of FIG. 24 also has a problem similar to the description in the first embodiment.

Figure 26:
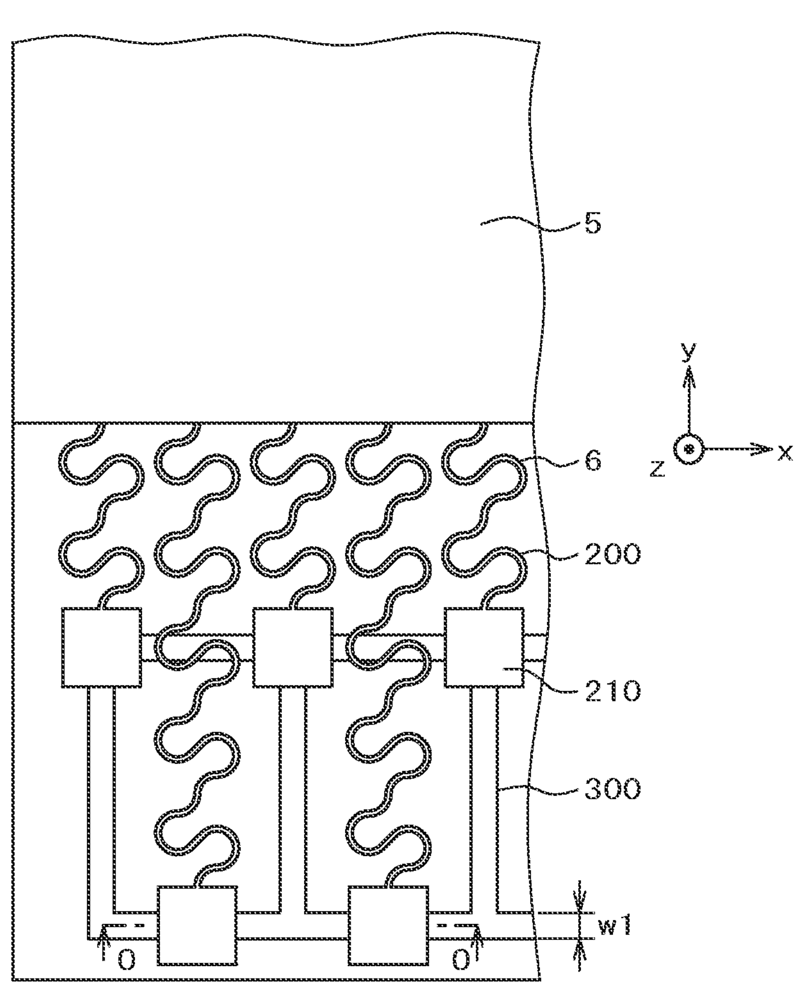
FIG. 26 is a plan view of a stretchable electronic device according to a second embodiment.

FIG. 26 is a plan view in the case where the present invention is applied to the configuration in which the terminals are arranged in two lines. Since the terminals are formed in two lines, the tensile strength needs to be adjusted not only in the lateral direction (x direction) but also in the vertical direction (y direction). Therefore, in FIG. 26, the connecting parts 300 are formed in the lateral direction (x direction) and the vertical direction (y direction). The tensile strength at the terminal 210 part is adjustable by the width w1 of the connecting part 300.

Figure 27:
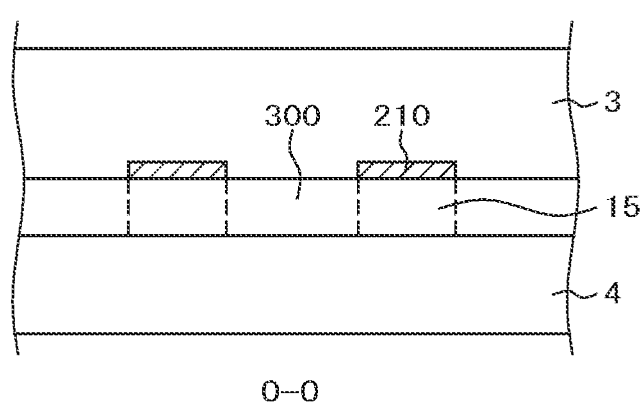
FIG. 27 is an O-O cross-sectional view of FIG. 26.

FIG. 27 is an O-O cross-sectional view of FIG. 26. In FIG. 27, the dotted lines between the base material 15 and the connecting part 300 are for illustrative purposes only, they are actually formed of the same polyimide, and no boundary exists. In addition, the base material 15 and the connecting part 300 are formed of the same material, and the number of processes does not increase.

Figure 28:
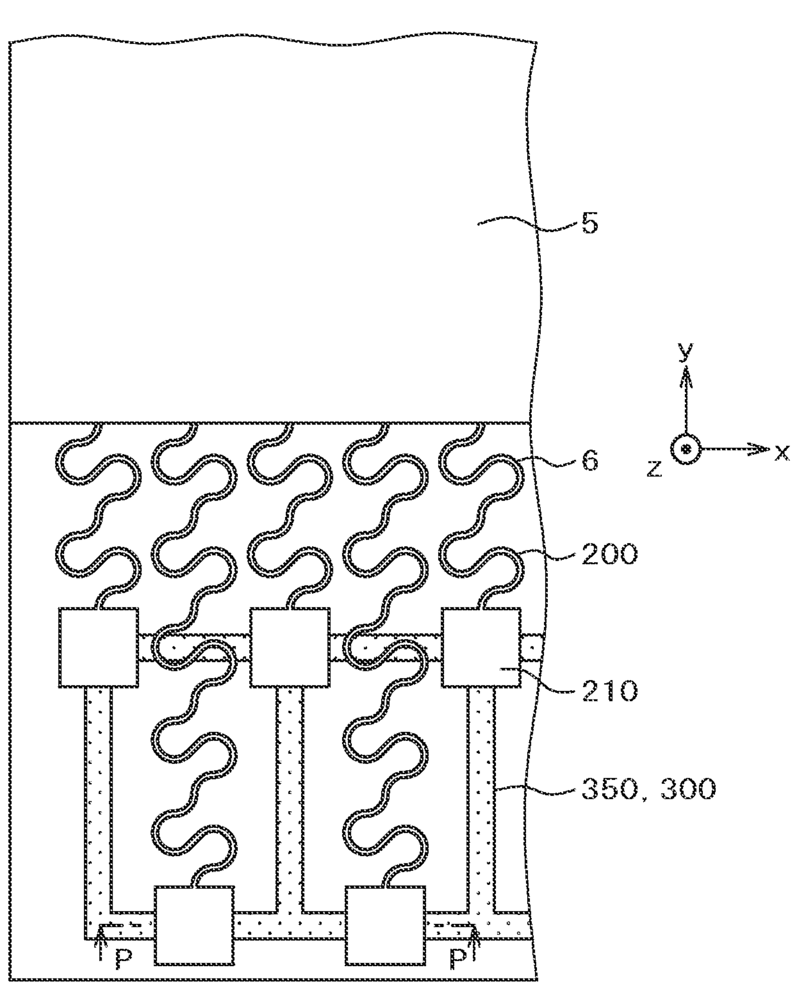
FIG. 28 is a plan view of a stretchable electronic device according to a second mode of the second embodiment.
Figure 29:
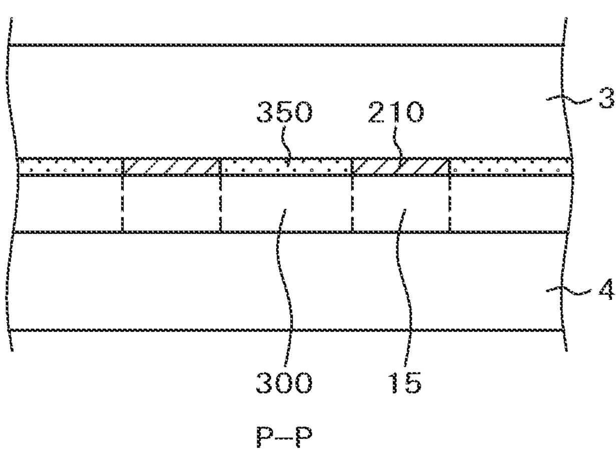
FIG. 29 is a P-P cross-sectional view of FIG. 28.

FIG. 28 is a plan view for depicting another mode of the second embodiment. The difference between FIG. 28 and FIG. 26 is that the second connecting part 350 is formed on the connecting part 300. FIG. 29 is a P-P cross-sectional view of FIG. 28. As similar to the description in the first embodiment, the material of the second connecting part 350 may be any material as long as it is an insulator. An inorganic film such as SiO or SiN may be used to effectively adjust the Young's modulus in the lateral direction (x direction).

Figure 30:
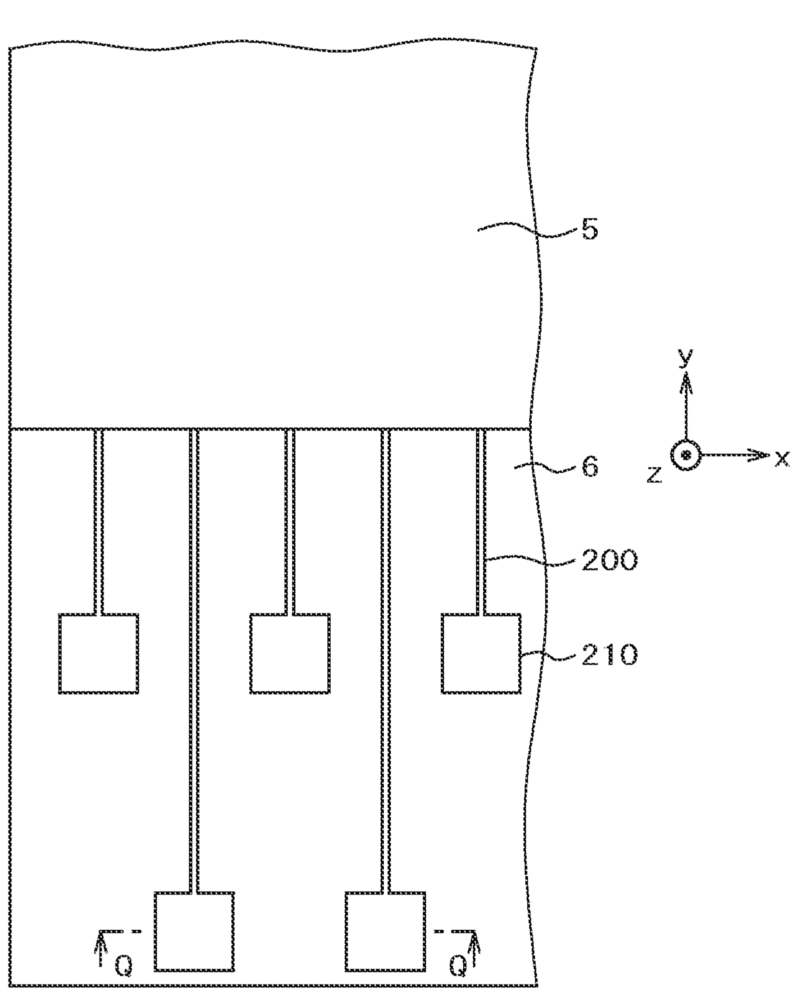
FIG. 30 is a plan view of a stretchable electronic device according to a fourth comparative example.
Figure 31:
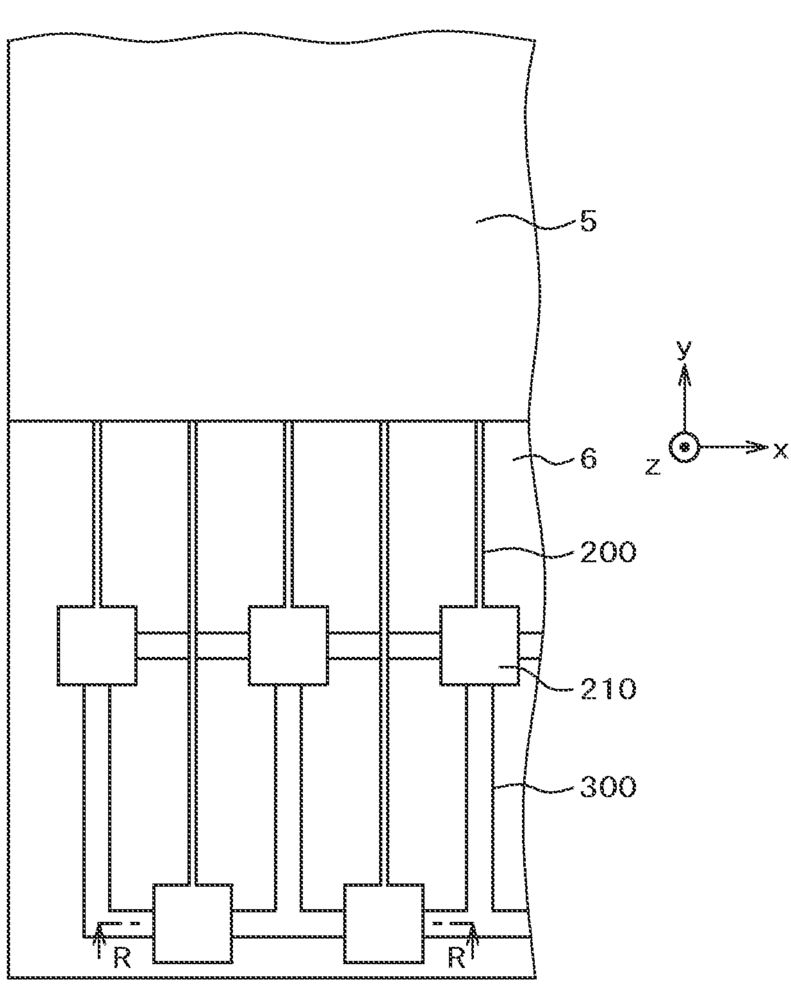
FIG. 31 is a plan view of a stretchable electronic device according to a third mode of the second embodiment.

FIG. 30 depicts a case where the terminal wirings 200 are straight lines. However, each wiring in the active area 5 has a meander structure. The Q-Q cross-sectional view of FIG. 30 is the same as FIG. 25. Therefore, even in the case where the terminal wirings 200 are straight lines, it has a problem similar to the case where the terminal wirings 200 have a meander structure. FIG. 31 is a plan view of the terminal area 6 in the case where the present invention is applied to the configuration of FIG. 30. The R-R cross-sectional view in FIG. 31 is similar to FIG. 27. As described above, even for the configuration as in FIG. 30, the stress caused by the difference in extensibility between the terminal area 6 and the flexible wiring substrate 150 can be reduced by employing the structure as described in FIG. 26 to FIG. 29.

Third Embodiment

The configurations of the first and second embodiments are such that the connecting part 300 is formed of the same material as the base material 15 or the second connecting part 350 is formed of a different material from the base material 15 on the side where the terminals 210 or the terminal wirings 200 are formed in the lower protective layer 4 and the like. This configuration increases the tensile strength of the terminal 210 in the alignment direction at the terminal 210 part of the terminal area 6 and, as a result, has the effect of relieving the stress between the terminal area 6 of the stretchable electronic device and the flexible wiring substrate.

A third embodiment employs a configuration in which the tensile strength of a terminal 210 in the alignment direction is increased in a terminal area 6 by forming a material having a larger Young's modulus than a lower protective layer 40, a base material 15, or the like on the side where the terminals 210 or terminal wirings 200 are formed in a lower protective layer 4 and the like. Accordingly, the effect of relieving the stress between the terminal 210 of the terminal area 6 and a flexible wiring substrate 150 is obtained.

Figure 32:
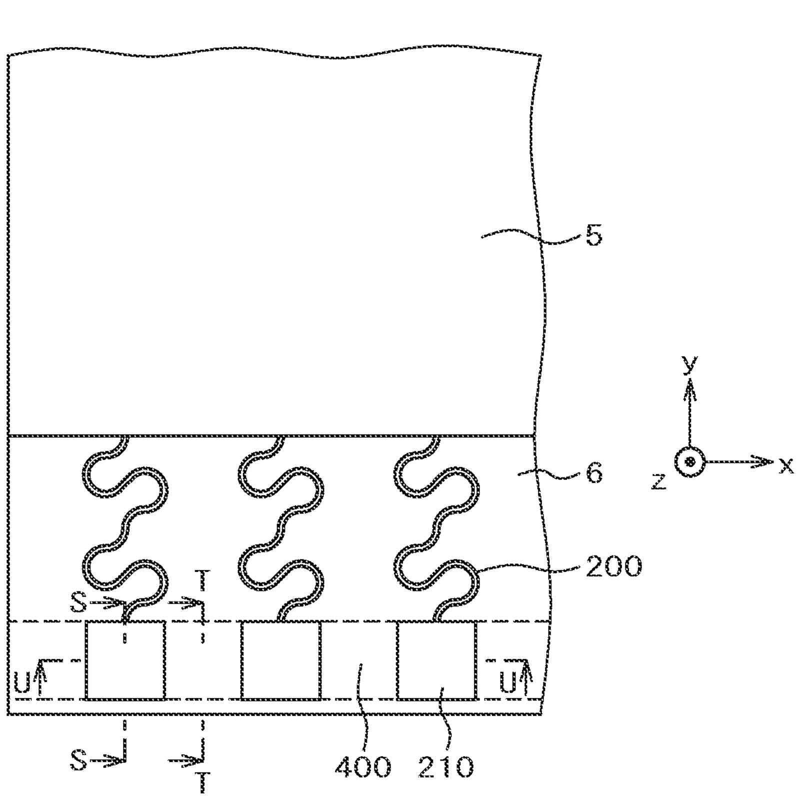
FIG. 32 is a plan view of a stretchable electronic device according to a third embodiment.

FIG. 32 is a plan view for depicting the first mode of the third embodiment. In the terminal area of FIG. 32, the configuration on the side where the terminals 210 and terminal wirings 200 are formed is the same as that described in FIG. 8. The feature of FIG. 32 is a configuration in which a third connecting part 400 that has almost the same width as the terminal 210 and extends in the lateral direction (x direction) is formed on the back side of a lower protective layer 4.

Figure 33:
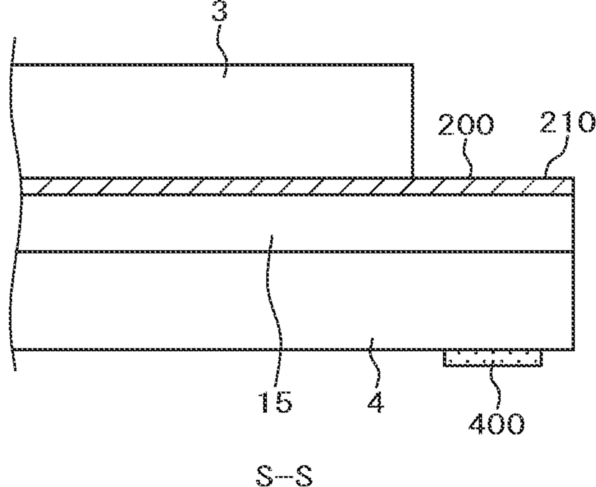
FIG. 33 is an R-R cross-sectional view of FIG. 32.
Figure 34:
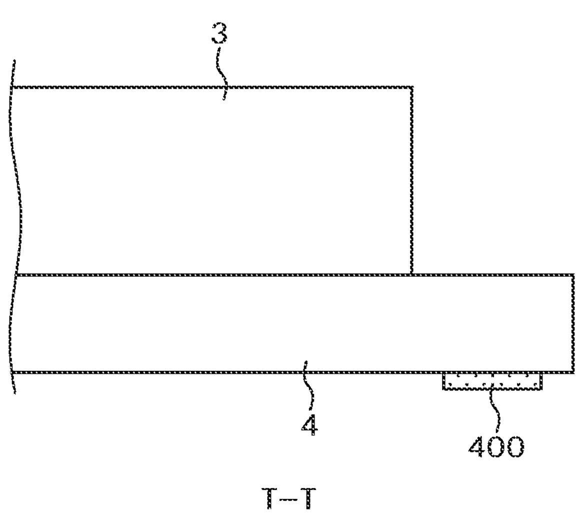
FIG. 34 is an S-S cross-sectional view of FIG. 32.
Figure 35:
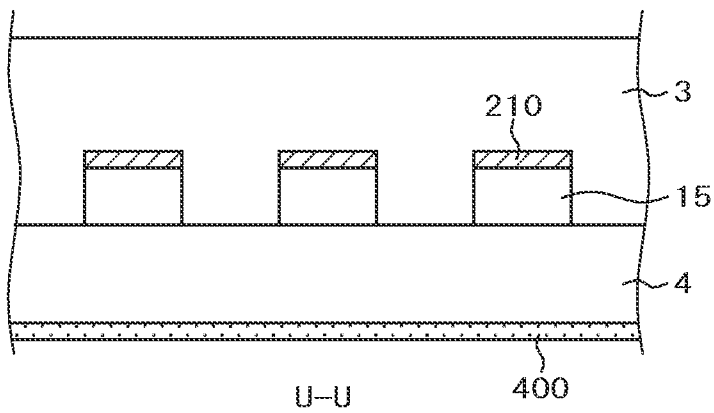
FIG. 35 is a T-T cross-sectional view of FIG. 32.

FIG. 33 is an S-S cross-sectional view of FIG. 32, FIG. 34 is an T-T cross-sectional view of FIG. 32, and FIG. 35 is a U-U cross-sectional view of FIG. 32. The Young's modulus of the material of the third connecting part 400 depicted in FIG. 33 to FIG. 35 is larger than that of the material configuring the lower protective layer 4 and the material configuring the base material 15. This is to obtain a predetermined effect without increasing the thickness of the third connecting part 400.

Since the terminal wirings 200 or the terminals 210 are not formed on the side where the third connecting part 400 is formed, a conductive material can be used as a material for the third connecting part 400. For example, a transparent conductive film such as indium tin oxide (ITO) or metal can be used. If the transparent conductive film is used, the appearance of the terminal area hardly changes. In the case where such a material is used, an effect can be obtained if the thickness of the third connecting part 400 is, for example, approximately 50 nm.

There is no problem if an insulating film is formed as the third connecting part 400. For example, since SiO or SiN has a large Young's modulus and is transparent, they are preferable for the third connecting part 400.

Figure 36:
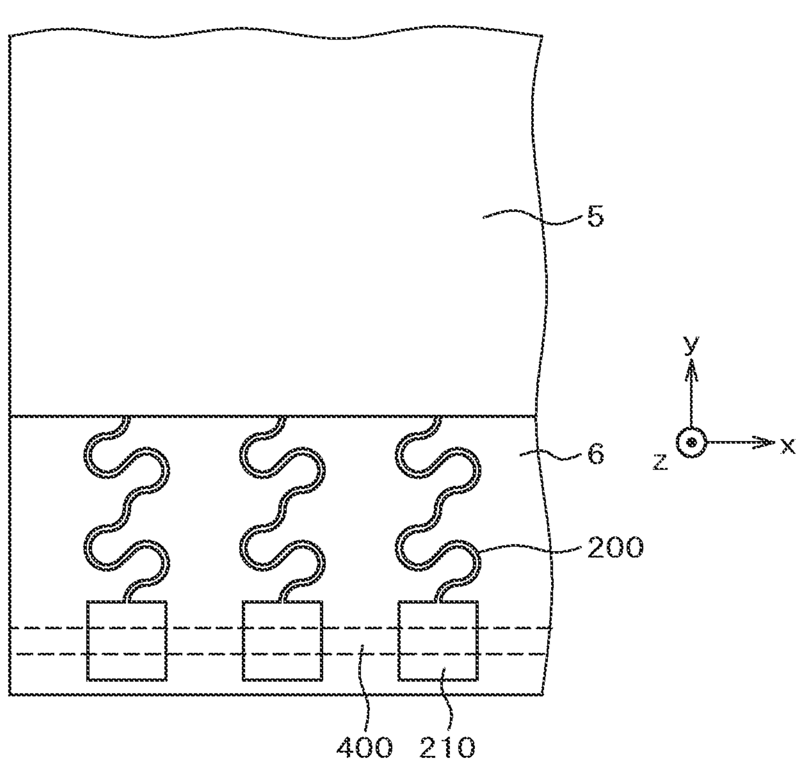
FIG. 36 is a plan view of a stretchable electronic device according to a third mode of the third embodiment.

In FIG. 32, the width of the third connecting part 400 is similar to that of the terminal 210, but this width can be changed as needed. FIG. 36 depicts a case where the width of the third connecting part 400 is smaller than that of the terminal 210. The width of the third connecting part 400 can be changed by taking into account the required tensile strength in the lateral direction (x direction), and the Young's modulus, the thickness, and the like of the material forming the third connecting part.

Figure 37:
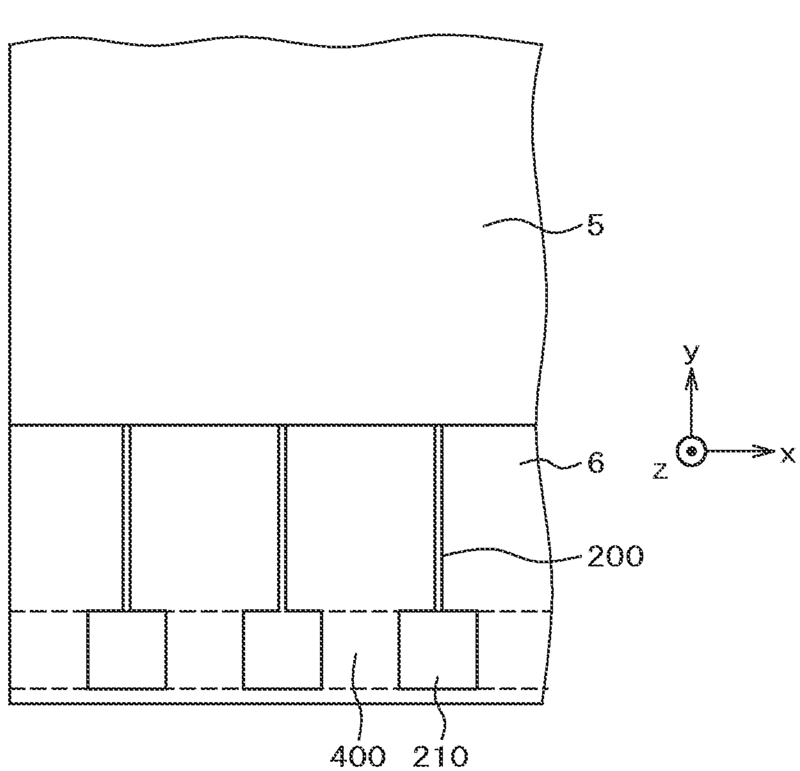
FIG. 37 is a plan view of a stretchable electronic device according to a fourth mode of the third embodiment.
Figure 38:
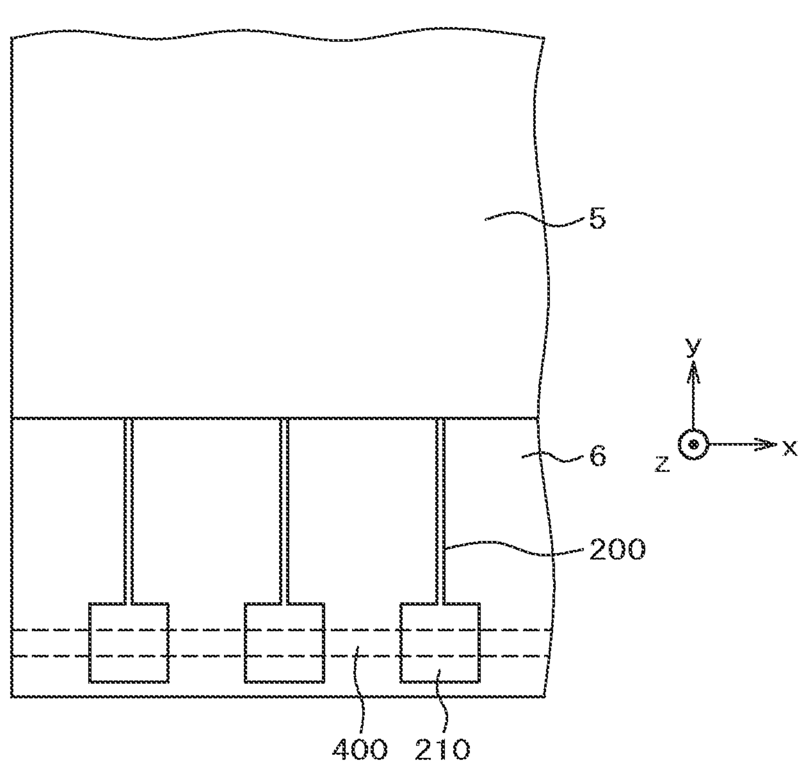
FIG. 38 is a plan view of a stretchable electronic device according to a fifth mode of the third embodiment.

Although FIG. 32 to FIG. 36 depict the case where the terminal wirings 200 of the terminal area 6 have a meander structure, the third connecting part 400 can be similarly applied to the case where the terminal wirings 200 are straight lines. FIG. 37 is a plan view corresponding to FIG. 32. FIG. 38 is a plan view corresponding to FIG. 36. In either case, the configuration described in the meander structure can be applied to the structure of the third connecting part 400.

What is claimed is:

1. An electronic device comprising:

a base material that has a meander structural part and an element area part;

a wiring that is positioned at the meander structural part; and an element that is positioned at the element area part and connected to the wiring, wherein the electronic device has an active area and a terminal area, in the active area, a plurality of element area parts is provided, and the meander structural part is formed so as to connect the element area parts to each other, a plurality of terminals aligned in a first direction is formed in the terminal area, the base material has a connecting part in the terminal area, the plurality of terminals is positioned at the connecting part, the connecting part is continuously formed in the first direction and configured to control a Young's modulus of the terminal area in the first direction so as to reduce stress caused by a difference in stretchability between the electronic device and an external flexible wiring substrate.

2. The electronic device according to claim 1, wherein the width of the connecting part in a second direction intersecting the first direction is the same as that of the terminal in the second direction.

3. The electronic device according to claim 1, wherein the width of the connecting part in a second direction intersecting the first direction is smaller than that of the terminal in the second direction.

4. The electronic device according to claim 1, wherein the base material is formed of polyimide.

5. The electronic device according to claim 1, wherein the connecting part has an insulating layer positioned between the plurality of terminals, and the insulating layer is formed of a material different from the base material.

6. The electronic device according to claim 5, wherein the thickness of the insulating layer is smaller than that of the base material.

7. The electronic device according to claim 5, wherein a Young's modulus of the insulating layer is larger than that of the base material.

8. The electronic device according to claim 5, wherein the width of the insulating layer in a second direction intersecting the first direction is the same as that of each of the plurality of terminals in the second direction.

9. The electronic device according to claim 1, wherein the plurality of terminals has a first line aligned in the first direction and a second line separated in a second direction intersecting the first line and the first direction.

10. An electronic device in which an active area and a terminal area are continuously formed, the device comprising:

a base material that has a meander structural part and an element area part;

a wiring that is positioned at the meander structural part; and an element that is positioned at the element area part and connected to the wiring, wherein in the active area, a plurality of element area parts is provided, and the meander structural part is formed so as to connect the element area parts to each other, a plurality of terminals aligned in a first direction is formed in the terminal area, the plurality of terminals is formed on one surface of the base material, on the other surface of the base material, a connecting part is formed in parts corresponding to the plurality of terminals, the connecting part being formed of a material having a Young's modulus larger than that of the base material and configured to control a mechanical property of the terminal area in the first direction.

11. The electronic device according to claim 10, wherein the thickness of the connecting part is smaller than that of the base material.

12. The electronic device according to claim 10, wherein the width of the connecting part in a second direction intersecting the first direction is the same as that of each of the plurality of terminals.

13. The electronic device according to claim 10, wherein the connecting part is metal.

14. The electronic device according to claim 10, wherein the connecting part is indium tin oxide.

15. The electronic device according to claim 10, wherein the connecting part is an inorganic insulating film.

* * * * *